United States Patent
Kelly et al.

(10) Patent No.: US 6,973,241 B2
(45) Date of Patent: Dec. 6, 2005

(54) REDUCTION OF TRUNCATION LOSS OF A TAPERED ACTIVE WAVEGUIDE

(75) Inventors: Anthony Edward Kelly, West Kilbride (GB); Graham John Woodgate, Henley-on-Thames (GB)

(73) Assignee: Kamelian Limited, Oxford (GB)

( * ) Notice: Subject to any disclaimer, the term of this patent is extended or adjusted under 35 U.S.C. 154(b) by 66 days.

(21) Appl. No.: 10/601,004

(22) Filed: Jun. 19, 2003

(65) Prior Publication Data
US 2004/0062485 A1 Apr. 1, 2004

(30) Foreign Application Priority Data
Jun. 21, 2002 (GB) .................................... 0214426

(51) Int. Cl.⁷ ............................................. G02B 6/26
(52) U.S. Cl. ..................... 385/50; 385/14; 385/43; 372/50
(58) Field of Search ............................. 385/10–14, 43, 385/50; 372/44–50

(56) References Cited

U.S. PATENT DOCUMENTS

| 5,844,929 A | 12/1998 | Lealman et al. ............... 372/45 |
| 6,253,009 B1 | 6/2001 | Lestra et al. ................... 385/50 |
| 2003/0210866 A1 * | 11/2003 | Kuhara et al. ................. 385/49 |

FOREIGN PATENT DOCUMENTS

GB 2 326 020 A 12/1998 ........... H01S 3/085

* cited by examiner

*Primary Examiner*—Phan T. H. Palmer
(74) *Attorney, Agent, or Firm*—Sierra Patent Group, Ltd.

(57) ABSTRACT

A semiconductor optical device comprises an active waveguide having a tapered portion, and a passive waveguide extending beyond the end of the active waveguide and optically coupled to the tapered portion of the active waveguide. The passive waveguide beyond the end of the active waveguide supports an optical mode of larger size than the optical mode supported by the active waveguide. The tapered portion of the active waveguide is truncated and the separation between the active waveguide and the passive waveguide is greater than in previously known devices in order to minimize or at least reduce the truncation loss at the truncation.

19 Claims, 3 Drawing Sheets

REDUCTION OF TRUNCATION LOSS OF A TAPERED ACTIVE WAVEGUIDE

CROSS REFERENCE TO RELATED APPLICATIONS

This application claims priority of United Kingdom Application No. 0214426.9, filed Jun. 21, 2002.

FIELD OF THE INVENTION

The present invention relates to semiconductor optical devices such as a semiconductor optical amplifier or a laser. In particular, the present invention relates to devices having an active waveguide which is tapered to change the size of the optical mode. Such devices may be referred to as mode-expanders.

BACKGROUND OF THE INVENTION

The size of the optical mode supported by the active waveguide of a typical semiconductor optical device is significantly smaller than the size of the mode supported by standard single-mode optical fibers. For efficient optical coupling between the optical device and the optical fiber, it is known to provide the optical device with some means for expanding the size of the optical mode. This may be achieved by arranging a lens or other optical element between the optical device and the optical amplifier, but the use of such a lens creates difficulties in manufacture.

As an alternative to the use of a lens, there have been developed semiconductor optical devices in which the waveguide within the semiconductor chip of the optical device is arranged to convert the size of the optical mode between the small size supported by the active waveguide and a larger size at the input or output facets to more closely match the mode size of the optical fiber. This provides the advantage of allowing more efficient optical coupling between the optical device and an optical fiber. It also reduces the mechanical tolerances with which the optical device and optical fiber must be aligned. Such optical devices may be referred to as "spot-size converting", "mode expanding", "mode-matched" or by other similar terms.

A number of arrangements for achieving spot-size conversion are known. In one such known arrangement, to which the present invention relates, the semiconductor optical device comprises an active waveguide having a tapered portion and a passive waveguide optically coupled to the tapered portion of the active waveguide. In this case, the passive waveguide supports an optical mode of larger size than the optical mode supported by the active waveguide. The optical coupling and the lateral taper result in the light transferring between the smaller optical mode supported by the active waveguide and the larger optical mode supported by the passive waveguide.

An example of a semiconductor optical device having such an arrangement with a tapered active waveguide is disclosed in U.S. Pat. No. 5,844,929, wherein the width of the active waveguide is tapered.

Ideally, where a taper is used, the tapered portion of the active waveguide would be tapered to an infinitely sharp point. However, if the active waveguide is tapered to a very sharp point, then the structure is not robust. The sharp point becomes very fragile and tends to fracture. Also, if the active waveguide is notch-etched as is conventional to avoid surface defects, then the overhanging layer above the active waveguide becomes fragile. Therefore, to provide a reliable and repeatable manufacturing process, normally the tapered portion of the active waveguide is truncated. Such a truncation causes a coupling loss as the light transfers between the passive waveguide and the active waveguide. This coupling loss may be referred to as a "truncation loss". Typically the truncation loss is of the order of 1 dB at each tapered portion.

A truncation loss is undesirable because it reduces the overall gain of the optical device. As this occurs near the end facets of the optical device, it may have a similar effect to a coupling loss between the optical device and the optical fiber.

In a semiconductor optical device of the type described above, it would be desirable to reduce the truncation loss, and preferably to minimize the truncation loss. Even small reductions of the loss are important in current systems, particularly in telecommunications applications. The demand to manage the overall noise figure and "loss budget" of a system including plural devices means that improvements of the order of 0.1 dB or more would be significant.

BRIEF SUMMARY OF THE INVENTION

According to a first aspect of the present invention, there is provided a semiconductor optical device comprising: an active waveguide having a tapered portion; and a passive waveguide extending beyond the end of the active waveguide and optically coupled to the tapered portion of the active waveguide, the passive waveguide beyond the end of the active waveguide supporting an optical mode of larger size than the optical mode supported by the active waveguide, wherein the tapered portion of the active waveguide is truncated and the separation between the active waveguide and the passive waveguide is greater than 0.2 $\mu$m.

In known optical devices, the separation between the active waveguide and the passive waveguide has been minimized. This has apparently been on the assumption that the active waveguide and the passive waveguide should be as close as possible to maximize the optical coupling therebetween. Usually, a small separation is provided, for example by providing a spacer layer between the active waveguide and the passive waveguide. For example, if the active waveguide is shaped by wet etching, the spacer layer may be present to stop the etching and protect the passive waveguide, as for example in U.S. Pat. No. 5,844,929 referred to above.

In known optical devices, the separation is typically up to 0.2 $\mu$m.

The present invention is based on an appreciation that in order to minimize truncation loss, it is not in fact desirable to minimize the separation between the active and passive waveguides. Actually, the truncation loss may be reduced by increasing this separation somewhat. Therefore, the present invention involves the separation being higher than the separation for previously known optical devices.

The reason why increase of the separation reduces the truncation loss is as follows. Increasing the separation reduces the effective modal refractive index of the composite waveguide structure formed by the tapered portion of the active waveguide and the overlapping portion of the passive waveguide. As a result, the effective modal refractive index of this composite waveguide structure more closely matches the modal refractive index of the passive waveguide. Thus, the step in the effective modal index at the point of the truncation of the tapered portion of the active waveguide is reduced. This reduces the truncation loss, because it is this step in the modal refractive index which causes the truncation loss.

Another way to view this is that the increased separation causes the optical mode in the active waveguide to be less confined and hence to better overlap the output passive mode supported in the passive waveguide beyond the end of the active waveguide.

In fact, there is an optimum separation for any given construction of waveguide. The optimum separation varies depending on the actual construction. For example, the optimum separation increases with the thickness of the active waveguide, the truncation width and the difference in refractive index, between on one hand the active and passive waveguides, and on the other hand the surrounding material. At the optimum separation, the truncation loss is minimized.

Preferably in accordance with the present invention, the separation is the optimum separation. However, an advantageous reduction in the truncation loss may still be achieved if the separation provides a truncation loss which is, say, 0.1 dB, 0.2 dB or 0.5 dB above the minimum coupling loss provided by the optimum separation. Preferably, the separation between the active waveguide and the passive waveguide provide a truncation loss which is at least 0.1 dB below the coupling loss which would occur in a device having the same construction except with a typical known separation of, say, 0.2 µm.

In accordance with another aspect of the present invention, there is provided a semiconductor optical device comprising: an active waveguide having a tapered portion; and a passive waveguide extending beyond the end of the active waveguide and optically coupled to the tapered portion of the active waveguide, the passive waveguide beyond the end of the active waveguide supporting an optical mode of larger size than the optical mode supported by the active waveguide, wherein the tapered portion of the active waveguide is truncated and the separation between the active waveguide and the passive waveguide provides a coupling loss between the active waveguide and the passive waveguide which is at most one of 0.1 dB, 0.2 dB or 0.5 dB above the minimum coupling loss provided by the optimum separation.

The present invention may be applied to any type of semiconductor optical device including a Fabry-Perot laser, a DFB laser, a tunable laser, an electro-absorption modulator or indeed any edge-coupled semiconductor optical device. However, the present invention is of particular application to a semiconductor optical amplifier, especially for use in a telecommunications system for which the reduction in loss is a significant advantage.

The present invention is particularly applicable to semiconductor optical devices of a known type comprising a semiconductor chip having a layered construction. In this case, the active waveguide typically comprises at least one layer of active material and the passive waveguide typically comprises at least one layer extending beyond the active waveguide and overlapping the tapered portion of the active waveguide. Most conveniently, the passive waveguide extends along the entire length of the active waveguide, but this is not essential and the passive waveguide need not overlap the active waveguide beyond the tapered portion of the active waveguide.

The present invention is of particular advantage to a semiconductor chip wherein the base material comprises In and P. In this case the active and passive waveguides may comprise GaAsInP. Devices based on InP have a relatively high difference in refractive index between, on one hand, the active and passive waveguides, and on the other hand, the surrounding material, so the truncation loss and hence the benefit provided by the invention are high. However the present invention is equally applicable to other semiconductor materials.

The present invention is applicable to any form of taper, for example a lateral taper in the width of the at least one layer constituting the active waveguide or a vertical taper in the height of the at least one layer constituting the active waveguide, or indeed a combination of a lateral and a vertical taper.

DETAILED DESCRIPTION OF THE INVENTION

The structure of an SOA 1 in accordance with the present invention and suitable for use within telecommunications networks will now be described by way of non-limitative example with reference to the accompanying drawings.

Figure 1:
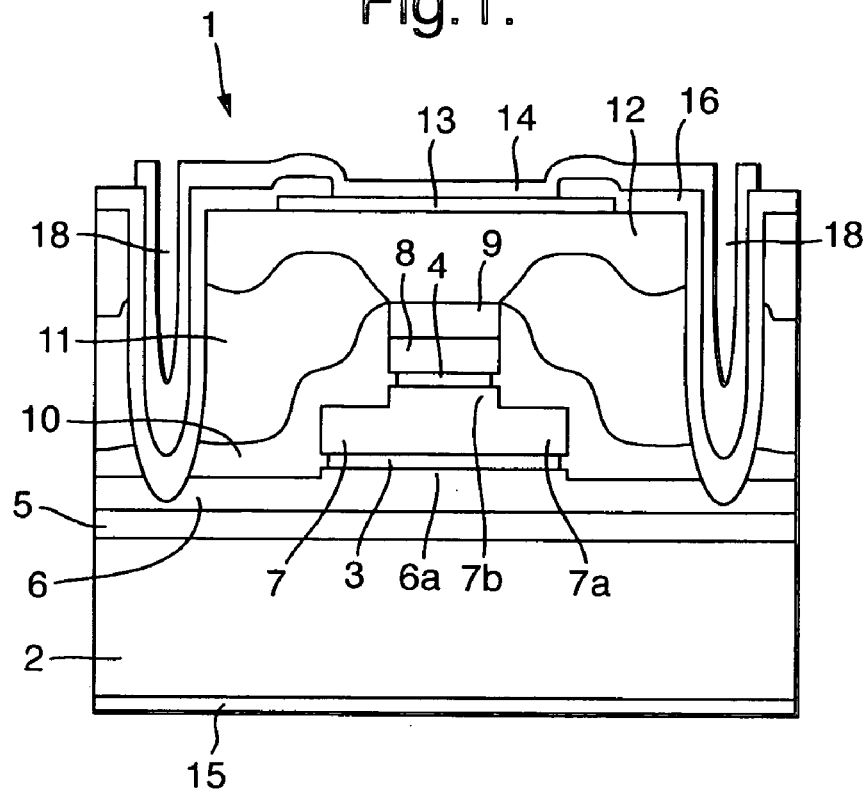
FIG. 1 is a cross-sectional view of a semi conductor optical amplifier (SOA), the cross-section being taken across the SOA perpendicular to the optical axis.

FIG. 1 is a cross-sectional view across the active region of the SOA 1 perpendicular to the optical axis.

The SOA 1 is formed as a single semiconductor wafer having a crystalline structure of semiconductor materials. Further SOAs may be formed in the same wafer. The base materials are In and P to provide a gain characteristic centred nearer the 1550 nm band of channels, but alternatively other semiconductor materials could be used. The SOA 1 has a layered construction of successive layers and may be manufactured by a deposition process such as MOCVD (metalorganic chemical vapour deposition) or MBE (molecular beam epitaxy) together with lithographic techniques, such manufacture being in itself conventional. The layers will now be described in more detail.

A substrate 2 of base material InP is provided with a greater thickness than the other layers to impose a crystal lattice on those other layers.

Above the substrate 2, the SOA 1 has a waveguide structure comprising a passive layer 3 and an active layer 4 constituted by active and passive materials, respectively, that is InGaPAs in appropriate proportions. The passive layer 3 and the active layer 4 have a width less than that of the substrate 2 and are surrounded by various layers of material, typically InP, having a lower refractive index than the passive layer 3 and the active layer 4 to create optical confinement of light within the passive and active layers 3 and the active layer 4 which therefore act as waveguides.

The active layer 4 has a width less than that of the passive layer 3. The active layer 4 also has a higher refractive index than the passive layer 3. As a result, although the passive and active layers 3 and 4 should really be considered as a composite waveguide, in the active region the light is confined predominantly within the active layer 4. Thus it is correct to consider the optical mode as being supported by the active waveguide constituted by the active layer 4, rather than the passive waveguide constituted by the passive layer 3.

Between the substrate 2 and the passive layer 3, the SOA 1 has a buffer layer 5 of n-type InP adjacent the substrate 2 and a lower cladding layer 6 of InP. The lower cladding layer 6 is stepped to provide a protruding portion 6a of substantially the same width as the passive layer 3 and on which the passive layer 3 is formed.

Between the active and passive layers 4 and 3, there is formed an intermediate cladding layer 7, which is stepped to have a wide portion 7a of substantially the same width of the passive layer 3 found on the passive layer 3, and a narrow portion 7b of substantially the same width as the active layer 4 on which the active layer 4 is formed.

Above the active layer 4, the SOA 1 has an upper cladding layer 8 of InP adjacent the active waveguide 4 and a cap layer 9 of p-type InP. Both the upper cladding layer 8 and the cap layer 9 are of substantially the same width as the active layer 4.

Although the passive layer 3 and the active layer 4 are of substantially the same width as the adjacent layers, the passive layer 3 and the active layer 4 are preferably notch-etched during manufacture which is a conventional technique to remove surface defects. Such notch-etching slightly reduces the width of the active and passive layers 4 and 3 so that the adjacent layers overhang.

The SOA 1 further has a first current blocking layer 10 of p-type InP provided above the lower cladding layer 6 and covering the sides of the passive waveguide 3, the intermediate cladding layer 7, the active waveguide 4 and the upper cladding layer 8 and extending at least partially over the sides of the cap layer 9, preferably to the upper surface of the cap layer 9. A second current blocking layer 11 of n-type InP covers the first current blocking layer 10.

The second current blocking layer 11 and the cap layer 9 are covered by an overgrowth layer 12 of p-type InP. On the upper surface of the overgrowth layer 12, a contact layer 13 of InGaAs is provided.

The SOA 1 has an upper contact 14 in electrical contact with the contact layer 13 and a lower contact 15 in electrical contact with the substrate 2. The upper and lower contacts 14 and 15 are made of metal, such as gold.

The SOA 1 has a pair of trenches 18 extending along the length of the SOA 1 outside the contact layer 13 and the active and passive layers 4 and 3. The trenches 18 extend down into the buffer layer 5 below the first blocking layer 10, and optionally deeper.

For electrical isolation, an insulator layer 16 is provided extending on both sides of the SOA 1 in the respective trenches 18 in the wafer from below the first blocking layer 10 onto the upper surface of the overgrowth layer 12. The insulator layer 16 extends under the electrical contact 14 overlapping the edges of the contact layer 13. Thus the upper contact 14 contacts the contact layer 13 in a window between the edges of the insulator layer 16.

In use, a drive current is passed between the upper contact 14 and the lower contact 15. The drive current pumps the material of the active layer 4 which therefore amplifies the light passing along the active waveguide formed by the active layer 4.

In the active region of the SOA 1 illustrated in FIG. 1, the optical mode supported by the active waveguide 4 is amplified by the active material of the active layer 4. In this active region, the passive waveguide 3 has no importance and indeed may be omitted.

If SOA 1 had the structure illustrated in FIG. 1 along its entire length the size of the optical mode supported by the active waveguide 4 would be significantly smaller than the size of the mode supported by a standard single-mode optical fiber. This would cause coupling losses if the optical mode supported by the active waveguide in the active region were coupled directly to such an optical fiber.

Figure 2:
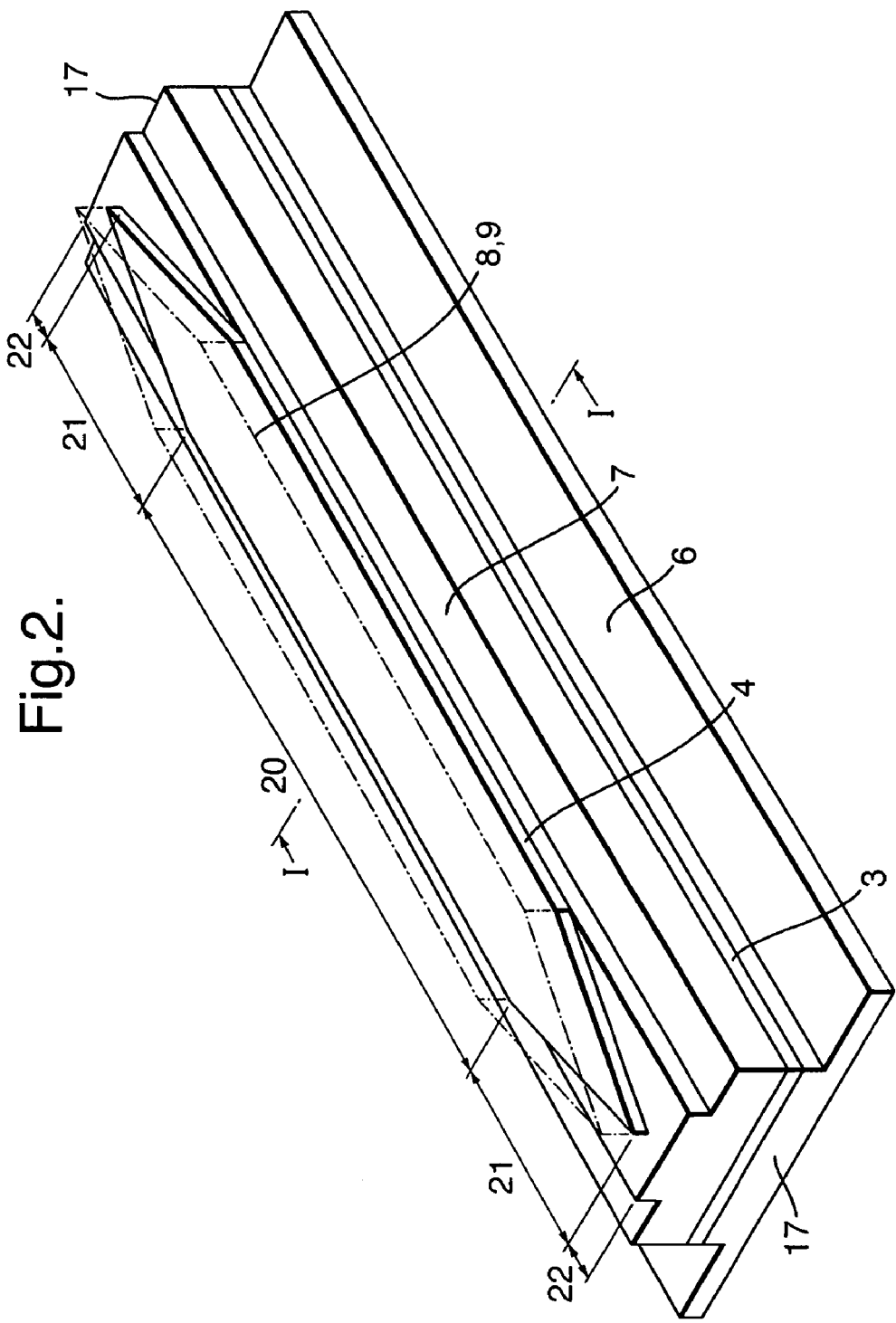
FIG. 2 is a perspective view of some of the layers of the SOA of FIG. 1 showing the shape of the active layer.

To reduce such coupling losses, the SOA 1 is arranged to expand the mode supported by the active waveguide at either end of the SOA 1 along the optical axis. In particular, the SOA1 has a construction as illustrated in FIG. 2 which is a perspective view of the lower cladding layer 6, the passive waveguide 3, the intermediate cladding layer 7 and the active waveguide 4 along the entire length of the SOA 1 between the end facets 17 of the SOA 1, the other layers of the SOA 1 being omitted from FIG. 2. The facets 17 are arranged to have a very low reflection, typically of the order of $10^{-3}$ or $10^{-4}$, for example by being formed with anti-reflection coatings.

The active region is the central region 20 illustrated in FIG. 2. At each end of the active region 20, there is a mode-expander region 21 in which the active layer 4 is laterally tapered, to constitute a tapered portion 40. In particular, in the tapered portion 40, the width of the active layer 4 perpendicular to the layers in the layered construction of the SOA 1 reduces. The tapered portion 40 of the active layer 4 terminates at the end of the mode-expander regions 21 beyond which there is a passive region 22. The upper cladding layer 8 and cap layer 9 have the same shape as the active layer 4, as shown in dotted outline in FIG. 2.

The remainder of the SOA 1 has the same construction as illustrated in FIG. 1. In particular, the passive waveguide 3 extends from the active region 20 along the mode-expander region 21 and beyond the end of the active waveguide 4 along the passive region 22.

In the passive region 22 the passive waveguide formed by the passive layer 3 supports an optical mode of larger size than that supported by the active waveguide in the active region 20. In the mode-expander region 21, the passive waveguide and the active waveguide have a separation (equal to the thickness of the intermediate cladding layer 7) such that they are optically coupled. As a result of the active layer 4 being tapered, as light propagates along the SOA 1, in both mode-expander regions 21 the light transfers between the optical mode supported by the passive waveguide in the passive region 22 and the optical mode supported by the active waveguide in the active region 20. Since the passive waveguide is arranged to support an optical mode of larger size than the active waveguide, the mode-expander region 21 converts the size of the optical mode between the smaller size supported by the active waveguide and the larger size supported by the passive waveguide. As the light propagates along the SOA 1, the conversion is a decrease in the mode-expander-region 21 at the input end and an increase in the mode-expander region 21 at the output end. The size of the optical mode supported by the passive waveguide is selected to more closely match the mode size of a standard single-mode optical fiber. This reduces coupling losses when the SOA 1 is coupled to an optical fiber at the facets 17. Of course, if the SOA 1 is intended to be coupled to an optical fiber at only one of the facets 17, it is possible to arrange the SOA 1 with a mode-expander region 21 at only that one end.

Figure 3:
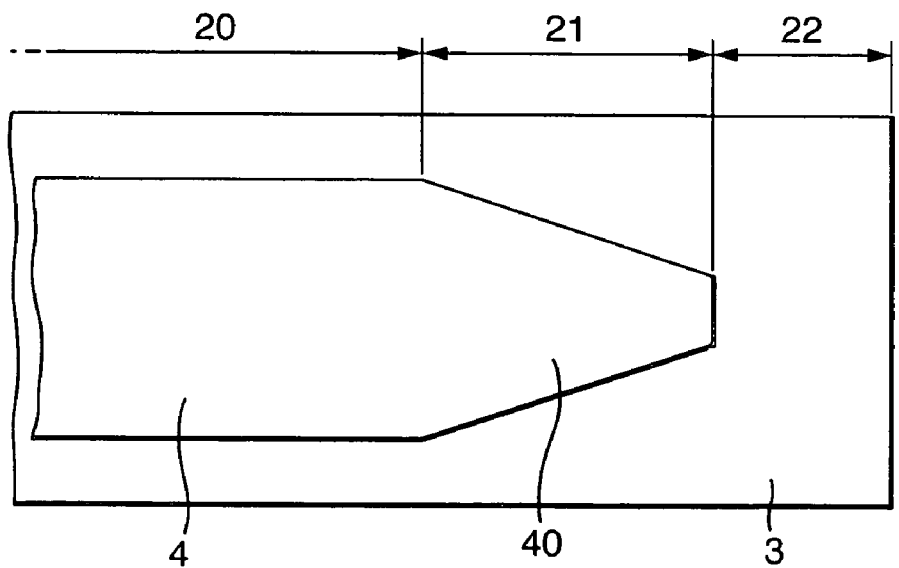
FIG. 3 is a plan view of the active and passive waveguides in the direction of the successive layers of the device.

Instead of tapering to a very sharp point, the tapered portion 40 of the active waveguide 4 is truncated, as illustrated in FIG. 3, which is a detailed plan view of the active layer 4 and the passive layer 3 at one end of the SOA 1 (the other end being identical). In particular, in the mode-expander region 21, the tapered portion 40 of the active waveguide 4 reduces in width progressing from the active region 20 to the passive region 22. The tapered portion 40 terminates at the boundary with the passive region 22 with a truncation, where the tapered portion 40 still has a finite width. The width of the truncation is selected to be as low as possible whilst still providing a robust construction. Relevant factors are the minimum width possible from the lithography process used to define the tapered portion 40 on the active layer and upper cladding layer 7, and the extent to which the active layer 4 can be subsequently notch-etched without the end of the active layer 4 and the overhanging portions of the upper cladding layer 7 becoming too fragile, which can cause fractures in the crystal structure. With current manufacturing techniques, the truncation width will be typically around 0.2 $\mu$m±0.05 $\mu$m, but may be as high as 0.5 $\mu$m or as low as 0.1 $\mu$m.

The separation between the active waveguide 4 and the passive waveguide 3 is selected as follows and may be controlled by control of the thickness of the intermediate cladding layer 7.

The separation is not minimized, but is increased based on the appreciation that a higher separation can reduce the truncation loss. In the following, reference will be made to the coupling loss of the active waveguide formed by the active layer 4 and the passive waveguide formed by the passive layer 3, that is the power loss measured in decibels of light transferring by the optical coupling between (1) the mode supported by the active waveguide 4 and (2) the mode supported by the passive waveguide 3 in the passive region 22 extending beyond the active waveguide 4. A coupling loss occurs at both the tapered portions 40 of the active waveguide 4, both when the light is coupled into and out of the active waveguide 4. Such a coupling loss results primarily from the truncation of the tapered portion 40, so it may also be termed a truncation loss.

Figure 4:
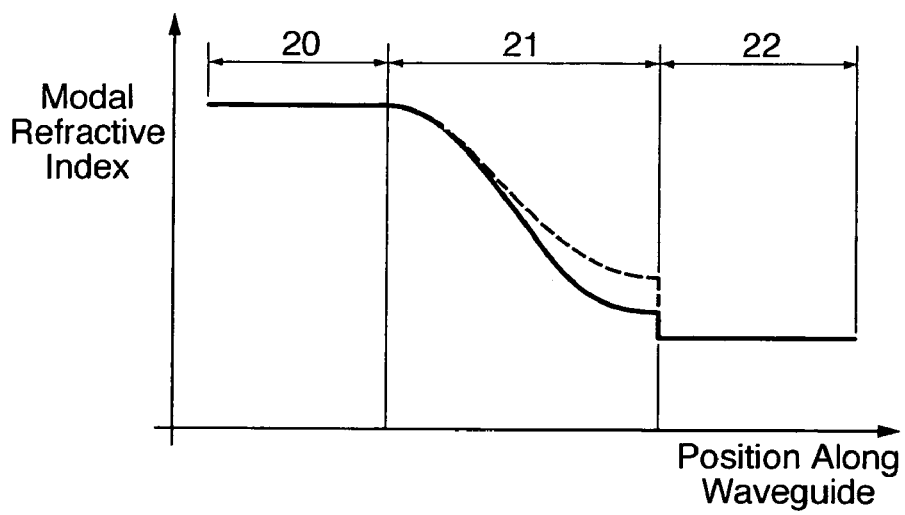
FIG. 4 is a graph along a portion of the optical axis of the optical device around the tapered portion of the active waveguide.
Figure 5:
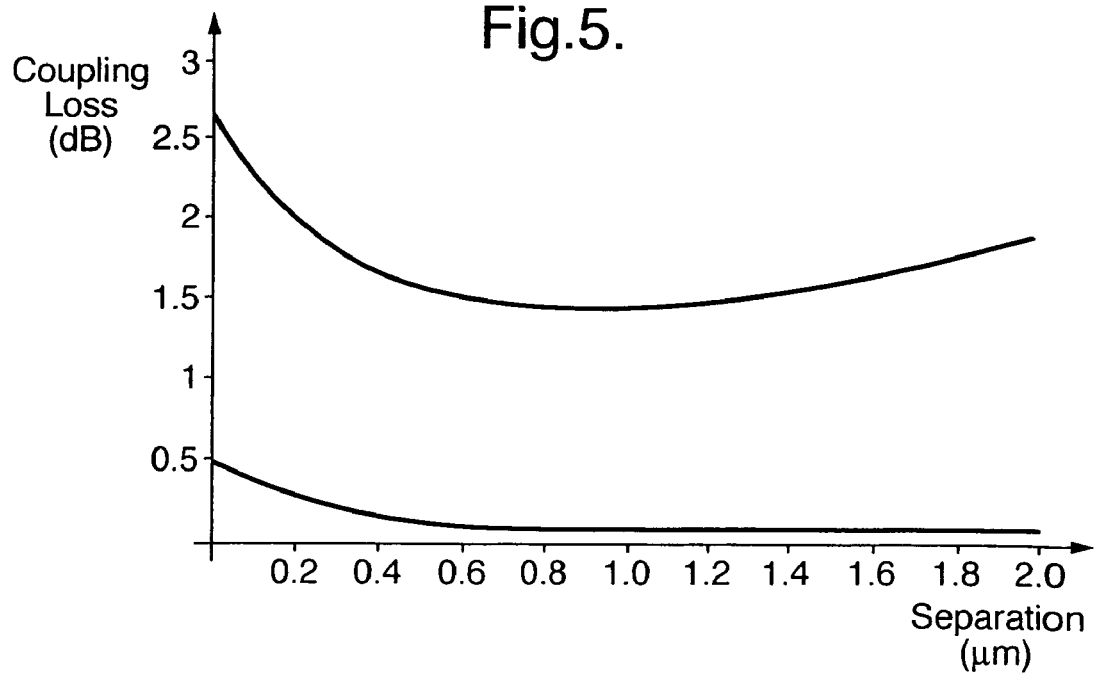
FIG. 5 is a graph of the coupling loss against the separation between the active and passive waveguides of the optical device, for two different thicknesses of the waveguide.

The reason for the reduction of the truncation loss will now be explained with reference to FIG. 4 which is a graph of the modal refractive index of the composite waveguide structure formed by the active waveguide 4 and the passive waveguide 3 along a portion of the optical axis of the optical device, showing the active region 20, the mode-expander region 21 where the tapered portion 40 of the active waveguide 4 overlaps by the passive waveguide 3 and the passive region 22 beyond the end of the active waveguide 4. In the mode-expander region 21, the modal refractive index is an effective index for the composite waveguide structure formed by the tapered portion 40 of the active waveguide 4 and the overlapping portion of the passive waveguide 3. The modal refractive index of the SOA 1 is shown by the continuous line 1. The modal refractive index of an optical device in which the separation is minimized is shown by the dotted line 2, where it differs from the present invention.

In the mode expander region 21, the taper of the active waveguide 4 causes the effective modal refractive index to reduce from its value in the active region 20 towards its value in the passive region 22. However, the truncation of the tapered portion 40 of the active waveguide 4 causes a step 3 in the effective modal refractive index at the point of the truncation, between the mode-expander region 21 and the passive region 22. This step in the effective modal index causes the coupling loss.

It has been appreciated by the present inventors that the coupling loss may be reduced by increasing the separation between the active waveguide 4 and the passive waveguide 3, because this results in the modal refractive index in the mode-expander region 21, where the active waveguide 4 tapers, being reduced. This reduction is shown by the continuous line 1 falling below the dotted line 2. As a result, the step 3 in the modal refractive index at the truncation of the tapered portion 40 is also reduced. Thus the coupling loss is reduced.

Therefore, in accordance with the present invention, the separation is increased relative to the separation in known optical devices where the separation is minimized. The separation between the active waveguide 3 and the passive waveguide 4, in particular the thickness of the intermediate cladding layer 7, may be precisely controlled during the deposition process used to form the intermediate cladding layer 7.

Another way to view the reduction of truncation loss is that the increased separation between the active waveguide 4 and the passive waveguide 3 causes the modes supported by the active waveguide 4 to be less confined and hence to better overlap the mode supported by the passive waveguide 3 in the passive region 22 beyond the end of the active waveguide. The increased overlap thus reduces the coupling loss.

In fact, there is an optimum separation between the active and passive waveguides 4 and 3. Above the optimum separation, the coupling losses start to increase again. This is thought to be caused by the effect of the separation increasing the separation between the modes supported by the active and passive waveguides 4 and 3 starting to dominate over the effect described above. Therefore, to prevent the separation becoming too great, the separation between the active waveguide 4 and the passive waveguide 3 is preferably at most 2.0 $\mu$m, 3.0 $\mu$m or 4.0 $\mu$m.

The optimum separation depends on the construction and size of the active and passive waveguides 4 and 3. For example, the optimum separation increases as the thickness of the active waveguide 4 decreases. The optimum separation will also change with other variations in the size of the active and passive waveguides 4 and 3, and with the construction of the active and passive waveguides 4 and 3. For example, the optimum separation will change if the active or passive waveguides 4 and 3 have a more complicated structure than the SOA 1 shown in FIG. 1, for example by having more than one layer or by the active waveguide having separate confinement heterostructure (SCH) layers. In the case of SCH layers being used, the SCH layers are considered to be part of the active waveguide 4 when considering the magnitude of separation between the active and passive waveguides.

For example, FIG. 2 illustrates the variation in coupling loss with the separation between the active and passive waveguides 4 and 3 for the optical device described above, but with the active waveguide 4 having two different thicknesses. Line 4 illustrates the coupling loss where the active waveguide 4 has a thickness of 0.2 $\mu$m whereas line 5 illustrates the coupling loss for the active waveguide 4 having a thickness of 0.1 $\mu$m. Otherwise the dimensions and constructions of the SOA 1 are the same for both lines 4 and 5. In particular, the substrate is InP of refractive index 3.16. The active waveguide 4 is GaAsInP (Q1.55) of refractive index 3.58 with a thickness of 0.2 $\mu$m, a width in the active region 20 where it is not tapered of 1.4 $\mu$m and a truncation width of 0.2 μm. The passive waveguide 3 is GaAsInP (Q 1.1) of refractive index of 3.28 with a thickness of 0.08 μm and a width of 5.0 μm.

When the active waveguide 3 has a thickness of 0.2 μm, the coupling loss shown by line 4 is minimized with an optimum separation of about 1.0 μm. At this optimum separation, the coupling loss is slightly below 1.5 dB, as compared to 2.0 dB for a typical known separation of 0.2 μm, or to more than 2.5 dB for no separation. Therefore, in this case the coupling loss at the optimum separation is improved by around 0.5 dB.

Considering the SOA 1 having the same construction except with the thickness of the active waveguide 4 being 0.1 μm the coupling loss shown by line 5 is minimal at an optimum separation around 2.0 μm. Thus the optimum separation increases as the thickness of the active waveguide reduces.

The optimum separation will also vary depending on other factors, for example, the construction and dimensions of the active and passive waveguides 4 and 3, the truncation width and the difference in refractive index between on one hand the active and passive waveguides and on the other hand the surrounding material.

Preferably, the separation is the optimum value for the particular construction of the SOA 1, or other optical device to which the invention is applied. However, an improvement in the coupling loss may still be achieved if the separation is not quite optimum. Therefore, in accordance with the present invention, the separation may take values which differ from the optimum separation but which nonetheless provide an improvement to the coupling loss as compared to a device having the same construction except with a separation for known optical devices, typically up to 0.2 μm. Therefore, according to one aspect of the present invention, the separation between the active and passive waveguide may provide a structure which is at least 0.1 dB below the coupling loss which would occur in a device having the same construction except with such a known separation. In accordance with another aspect of the present invention, the separation between the active and passive waveguides may vary from the optimum separation which minimizes the coupling loss by an amount which provides a coupling loss which is at most 0.1 dB or 0.2 dB or 0.2 dB or 0.5 dB above the minimum coupling loss for the optimum separation.

The coupling loss may be determined for any given structure of the waveguide by modelling that structure using conventional techniques such as beam propagation modelling (BPM) or similar modelling. Alternatively, the coupling loss may be measured experimentally for given optical devices, manufactured with different constructions. Therefore, using such techniques it is possible to determine the optimum separation and the coupling loss for other separations.

Selection of the optimum separation will provide a reduction in the truncation loss for a truncation of any size, but of course the magnitude of the reduction will decrease as the magnitude of the truncation and hence the truncation loss itself decrease. Thus the benefit provided by the present invention is most notable for larger truncation widths of say at least 0.05 μm or at least 0.1 μm, depending inter alia on the thickness of the active layer.

In the SOA 1, the tapered portion 40 of the active waveguide 4 has a taper laterally, that is the width of the active waveguide 4 is tapered. However the present invention is equally applicable to an active waveguide 4 which tapers in other ways to transfer the light between the active and passive waveguides 4 and 3. For example the invention is also applicable to an optical device in which an active waveguide has a vertical taper, that is in which the height of the active waveguide in the direction perpendicular to the successive layers is tapered. Practical limitations during manufacture again result in truncation of the taper causing a truncation loss which can be minimized by selection of the separation between the active and passive waveguides.

We claim:

1. A semiconductor optical device comprising:
   an active waveguide having a tapered portion; and
   a passive waveguide extending beyond the end of the active waveguide and optically coupled to the tapered portion of the active waveguide, the passive waveguide beyond the end of the active waveguide supporting an optical mode of larger size than the optical mode supported by the active waveguide,
   wherein the tapered portion of the active waveguide is truncated and the separation between the active waveguide and the passive waveguide provides a coupling loss between the active waveguide and the passive waveguide which is at most 0.5 dB above the minimum coupling loss provided by a device having the same construction except with an optimum separation between the active waveguide and passive waveguide which minimizes the coupling loss between the active waveguide and the passive waveguide.

2. A semiconductor optical device according to claim 1, wherein the separation between the active waveguide and the passive waveguide provides a coupling loss between the active waveguide and the passive waveguide which is at most 0.2 dB above the minimum coupling loss provided by the optimum separation.

3. A semiconductor optical device according to claim 2, wherein the active waveguide comprises active material which is one selected from the group consisting of bulk material and multi-quantum well material.

4. A semiconductor optical device according to claim 2, wherein the active waveguide comprises a layer of active material surrounded by further material having a lower refractive index than the active material.

5. A semiconductor optical device according to claim 1, wherein the active waveguide comprises at least one layer of active material, the width of at least one layer of active material being tapered in the tapered portion.

6. A semiconductor optical device according to claim 5, wherein the tapered portion of the active waveguide is truncated with a truncation width of one of at least 0.05 μm and at least 0.1 μm.

7. A semiconductor optical device according to claim 1, wherein the active waveguide comprises a single layer of active material.

8. A semiconductor optical device according to claim 7, wherein the thickness of the layer of active material is at least 0.2 μm.

9. A semiconductor optical device according to claim 1, wherein the passive waveguide comprises at least one layer overlapping the tapered portion of the active waveguide and extending beyond the active waveguide.

10. A semiconductor optical device according to claim 9, wherein at least one layer of the passive waveguide extends along the entire length of the active waveguide.

11. A semiconductor optical device according to claim 1, wherein the separation between the active waveguide and the passive waveguide provides a coupling loss between the active waveguide and the passive waveguide which is at most 0.1 dB above the minimum coupling loss provided by the optimum separation.

12. A semiconductor optical device according to claim 1, wherein the passive waveguide comprises a single layer of passive material.

13. A semiconductor optical device according to claim 1, wherein the semiconductor chip has a base material comprising In and P.

14. A semiconductor optical device according to claim 1, wherein the semiconductor optical device is a semiconductor optical amplifier.

15. A semiconductor optical device according to claim 1, wherein the active waveguide and the passive waveguide have a separation greater than 0.2 $\mu$m.

16. A semiconductor optical device according to claim 1, wherein the active waveguide and the passive waveguide have a separation greater than 0.3 $\mu$m or greater.

17. A semiconductor optical device according to claim 1, wherein the active waveguide and the passive waveguide have a separation of 0.4 $\mu$m or greater.

18. A semiconductor optical device according to claim 1, wherein the active waveguide and the passive waveguide have a separation of 0.5 $\mu$m or greater.

19. A semiconductor optical device according to claim 1, wherein the passive waveguide comprises a layer of passive material surrounded by further material having a lower refractive index than the passive material.

* * * * *